(12) United States Patent
Baek et al.

(10) Patent No.: US 6,498,395 B2
(45) Date of Patent: Dec. 24, 2002

(54) HEAT SINK WITH COOLING FINS FOR SEMICONDUCTOR PACKAGE

(75) Inventors: Joong-hyun Baek, Suwon (KR); Min-ha Kim, Cheonan (KR)

(73) Assignee: Samsung Electronics Co., Ltd. (KR)

( * ) Notice: Subject to any disclaimer, the term of this patent is extended or adjusted under 35 U.S.C. 154(b) by 26 days.

(21) Appl. No.: 09/843,096

(22) Filed: Apr. 25, 2001

(65) Prior Publication Data

US 2002/0063328 A1 May 30, 2002

(30) Foreign Application Priority Data

Nov. 24, 2000 (KR) .......................................... 2000-70493

(51) Int. Cl.⁷ ............................ H01L 23/34; H01L 23/10
(52) U.S. Cl. ....................................... 257/722; 257/706
(58) Field of Search ............................... 257/712, 706, 257/722; 361/695

(56) References Cited

U.S. PATENT DOCUMENTS

| | | | | |
|---|---|---|---|---|
| 4,541,004 A | * | 9/1985 | Moore | 257/706 |
| 5,019,880 A | * | 5/1991 | Higgins, III | 165/80.3 |
| 5,724,228 A | * | 3/1998 | Lee | 165/122 |
| 6,011,216 A | | 1/2000 | Kitahara et al. | 174/16.3 |
| 6,125,921 A | * | 10/2000 | Kuo | 165/185 |

* cited by examiner

Primary Examiner—Tom Thomas
Assistant Examiner—Samuel A Gebremariam

(57) ABSTRACT

An apparatus for cooling a semiconductor package and preventing heat concentration at the central part of a heat sink includes a heat sink for cooling mounted on a semiconductor package and a fan installed over the heat sink. The heat sink includes a base plate, a support bar installed over the base plate for supporting the fan, a plurality of parallel fins, whose lengths decrease in size from a peripheral part to a central part of the heat sink. The parallel fins extend from the base plate. The heat sink further includes air guide plates for guiding air flow in the heat sink to the central part thereof.

8 Claims, 4 Drawing Sheets

HEAT SINK WITH COOLING FINS FOR SEMICONDUCTOR PACKAGE

BACKGROUND OF THE INVENTION

1. Field of the Invention

The present invention relates to a semiconductor device, and more particularly, to an apparatus for cooling a semiconductor package.

2. Description of the Related Art

A central processing unit (hereinafter, referred to as "CPU") currently manufactured operates at speeds of greater than 500 MHz. With this increase in speed, power consumption increases. Meanwhile, increases in temperature at a chip junction part of the CPU may lead to a decrease in operation frequency. Consequently, it is necessary to maintain the junction temperature below a predetermined temperature to ensure reliability of the CPU.

To dissipate heat generated at a chip junction part in a semiconductor package to the air more effectively, a semiconductor package, on which a CPU chip is mounted, uses a ceramic substrate having more excellent heat properties than the existing plastic package. Also, a heat sink and a fan may be attached to more effectively dissipate heat in the semiconductor package outward. When operation frequency increases, electrical power consumption increases proportionally. Consequently, a larger or more efficient heat sink is required in order to use a device operating at high frequencies.

FIG. 1 is a cross-sectional view illustrating a conventional apparatus for cooling a semiconductor package, to which a heat sink and a fan are attached.

Referring to FIG. 1, a conventional heat sink 21, which is mounted over a semiconductor package 15, has a plurality of equal length, parallel fins 20. Heat generated from a semiconductor package body 14 is mostly transmitted to the heat sink 21 and a board (not shown) over which the semiconductor package 15 is mounted and particularly, the heat transmitted to the heat sink 21 is emitted outward by a convection current effect created by a fan 26. However, airflow is stagnant and heat is concentrated at the central part of the heat sink 21 due to a motor 22 at the center of the fan 26. Consequently, the convection current effect at the central part of the heat sink 21 decreases significantly. Moreover, a plurality of equal length, parallel fins 20 in the heat sink are formed at both a central part and a peripheral part of the heat sink 21. Therefore, the convention current effect thereof further decreases, and heat is further concentrated at the central part of the heat sink 21. Namely, the heat generated from the semiconductor package body 14 is ineffectively cooled.

SUMMARY OF THE INVENTION

To solve the above problems, it is an object of the present invention to provide an apparatus for cooling a semiconductor package capable of effectively cooling or dissipating heat generated from a semiconductor package body.

Accordingly, to achieve the above object, there is provided an apparatus for cooling a semiconductor package, including a heat sink mounted over a semiconductor package for dissipating heat and a fan installed over the heat sink, wherein the heat sink includes a base plate, a support bar installed over the base plate for supporting the fan, a plurality of parallel fins, whose lengths are shorter toward the central part of the heat sink, extending from the base plate and air guide plates for guiding the flow of air in the heat sink to the central part thereof.

The air guide plates are formed to be slanted along the fins, whose lengths get shorter from the peripheral part to the central part of the heat sink.

The air guide plates may be parallel and face each other so that air flows in a horizontal direction. Also, the air guide plates may be adjacent to each other crossing in a vertical direction and a horizontal direction so that air flows in a diagonal direction.

It is preferable that the central part of the heat sink comprises fins of the same length.

It is preferable that the fins are formed rectangularly to have a checkerboard form.

A motor is installed at the central part of the fan, and blades serving as a passage for the inflow and outflow of air are at the peripheral part of the fan. The fan may be attached to and detached from the heat sink.

BRIEF DESCRIPTION OF THE DRAWINGS

The above objectives and advantages of the present invention will become more apparent by describing in detail a preferred embodiment thereof with reference to the attached drawings, in which.

DESCRIPTION OF THE PREFERRED EMBODIMENT

Figure 1:
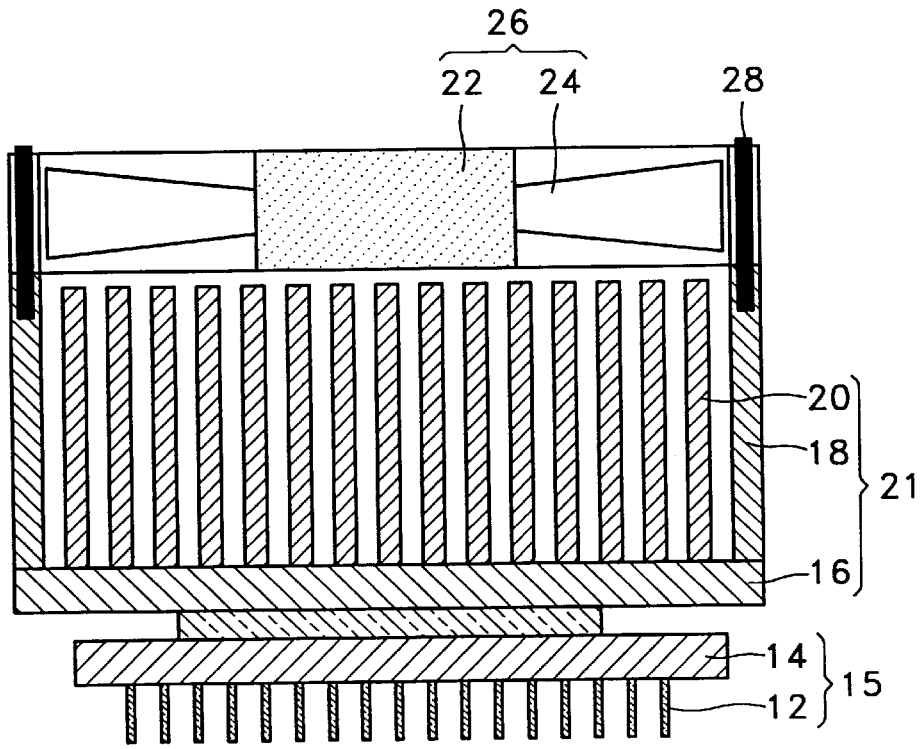
FIG. 1 is a cross-sectional view illustrating a conventional apparatus for cooling a semiconductor package, to which a heat sink and a fan are attached.

Hereinafter, an embodiment of the present invention will be described in detail with reference to the attached drawings. However, it will be apparent to one of ordinary skill in the art, and the scope of the present invention must not be interpreted as being restricted to the embodiment. Like reference numerals in the drawings denote the same members.

Referring to FIGS. 2 to 5, an apparatus for cooling a semiconductor package according to a preferred embodiment of the present invention comprises a heat sink 113 for cooling (or for dissipating heat) mounted on top of a semiconductor package 105 and a fan 118 installed over the heat sink 113.

The semiconductor package 105 comprises a semiconductor package body 104 and external connector means 102. A semiconductor chip, for example a CPU, is built into the semiconductor package body 104. The external connector means 102 are electrically connected to the semiconductor package body 104. The external connector means 102 may be of lead, a solder ball or a solder bump.

Figure 2:
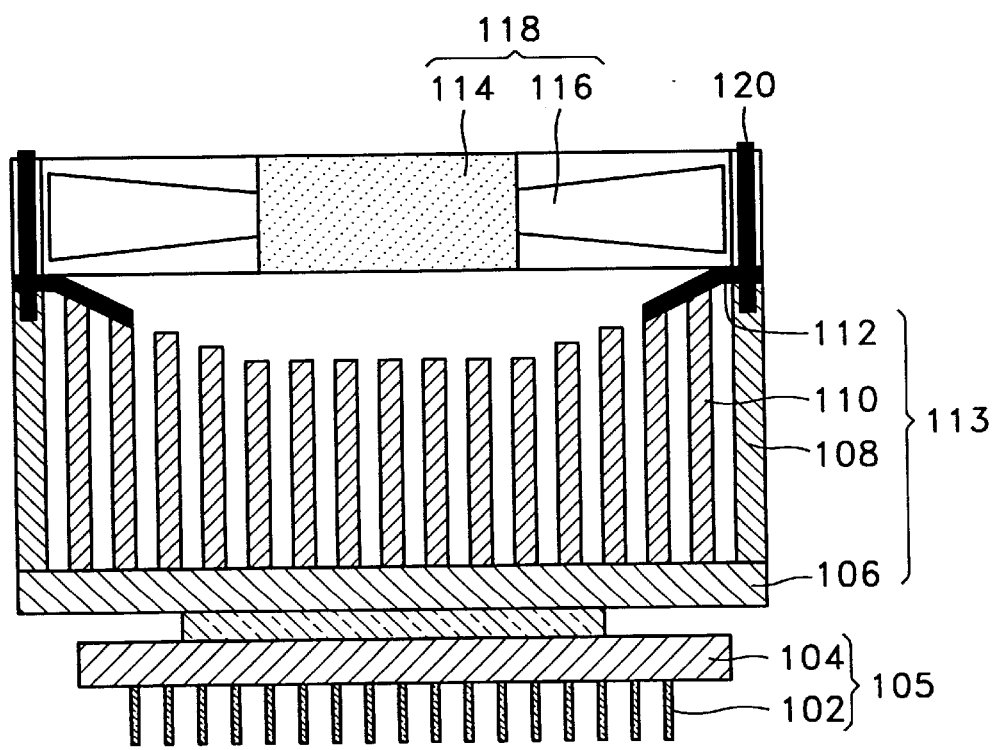
FIGS. 2 and 3 are cross-sectional views illustrating an apparatus for cooling a semiconductor package according to a preferred embodiment of the present invention.
Figure 3:
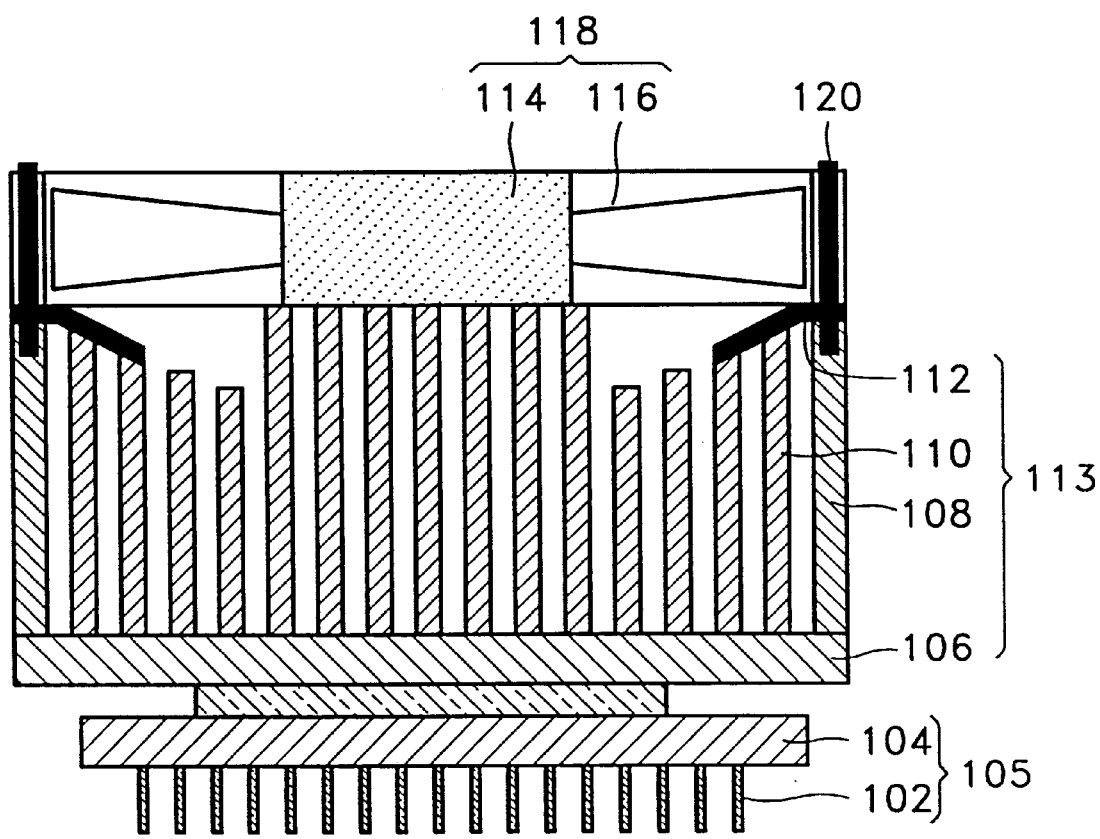
Figure 4:
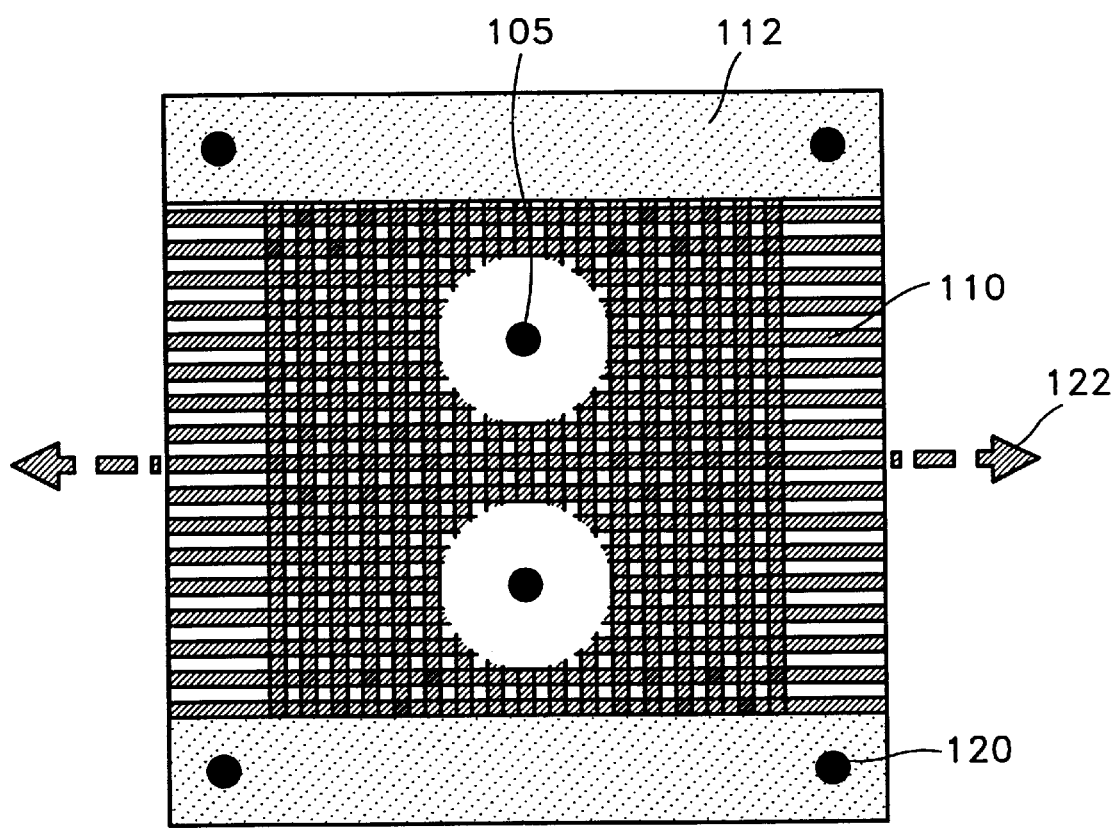
FIGS. 4 and 5 are plane views illustrating a heat sink according to a preferred embodiment of the present invention.
Figure 5:
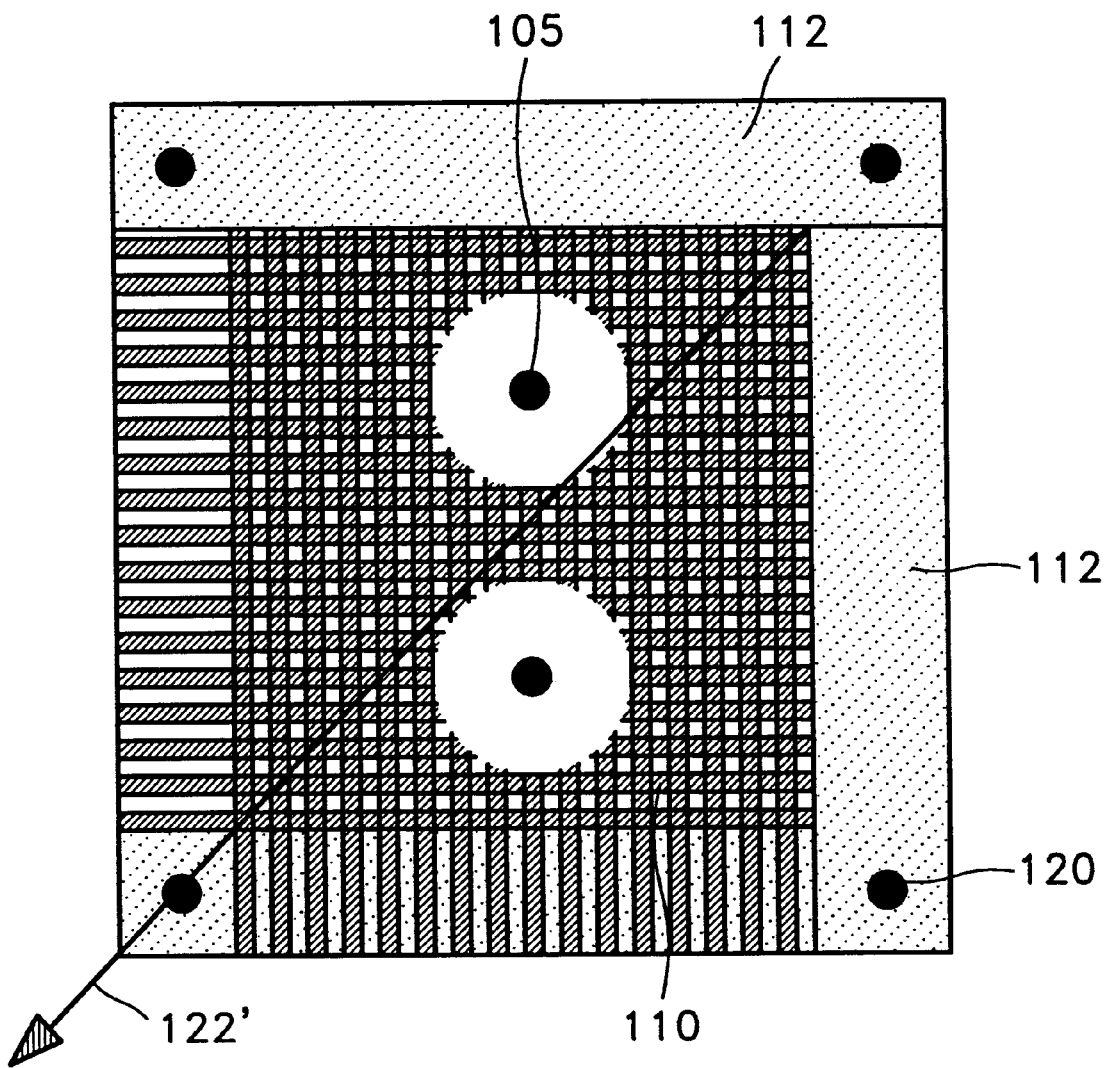

A heat sink 113 for dissipating heat generated from the semiconductor package body 104 is mounted on a semiconductor package 105. The semiconductor package 105 is connected to the heat sink 113 by a connector, for example a screw. The heat sink 113 comprises a base plate 106. Support bars 108 supporting the fan 118 are installed over the base plate 106. Also, a plurality of parallel fins 110, whose lengths decrease from the peripheral part to the central part of the heat sink 113, extend from the base plate 106. The lengths of the fins 110 decrease from the peripheral part to the central part of the heat sink 113 in order to guide airflow in the heat sink 113 to the central part thereof. As shown in FIGS. 4 and 5, it is preferable that the fins 110 are formed to be rectangular and have a checkerboard shape. Generally, it is known that a pin type fin is superior to a general plate type fin in terms of cooling efficiency. It is preferable that the fins have the same length at the central part of the heat sink 113. The central part of the heat sink 113 denotes the heat sink part, comprising fins of the same length, located below a motor 114 of the fan 118, which will be mentioned later. The fins at the central part of the heat sink 113, as shown in FIG. 2, may be shorter than those at the peripheral part. Also, as shown in FIG. 3, the fins at the central part of the heat sink 113 are longer than those at the peripheral part. Air guide plates 112 are connected to the support bars 108 by a connector 120. The connector 120 may be a hinge so that the air guide plates 112 can be removably attached to and detached from the support bars 108. It is preferable that the air guide plates 112 are formed to be slanted along the fins 110, whose lengths decrease from the peripheral part to the central part of the heat sink 113, to guide air flowing in the heat sink 113 to the central part thereof. The air guide plates 112, as shown in FIG. 4, may be parallel and face each other so that air flows in a horizontal direction 122. Alternatively, as shown in FIG. 5, the air guide plates 112 may be adjacent to each other at an angle, crossing in a vertical direction and a horizontal direction, so that air flows in a diagonal direction 122'. As shown FIGS. 2 and 3, in an apparatus for cooling a semiconductor package according to a preferred embodiment of the present invention, since the lengths of the fins 110 decrease from the peripheral part to the central part of the heat sink 113 and the air guide plates 112 are slanted, air flowing into the heat sink 113 through the fan 118 is effectively guided to the central part of the heat sink 113. Consequently, it can prevent heat concentration at the central part of the heat sink 113.

The fan 118 is mounted over the heat sink 113 so that ambient air flows into and out of the heat sink 113. The four corners of the fan are connected to the support bars 108 of the heat sink 113 by connectors 120, for example a hinge. The fan 118 may be removably attached to and detached from the heat sink 1I13. A motor 114 is situated at the central part of the fan 118 to drive the fan 118. The peripheral parts of the fan 118, namely, the blades 116 thereof become a passage for the inflow and outflow of air. In case the fan 118 is driven by the motor 114, ambient air may flow into and out of the heat sink 113 through the peripherals of the fan 118 thereby causing a convection current effect in the heat sink 113.

In an apparatus for cooling a semiconductor package according to the present invention, air guided to the peripheral part of a heat sink through a fan can be effectively guided to the central part of the heat sink. Consequently, since an air convection current effect in the heat sink can be improved greatly, it can prevent heat concentration at the central part of the heat sink, which is generated in a conventional apparatus for cooling a semiconductor package. Also, since heat generated from the semiconductor package can be effectively emitted, heat reliability of a product can be ensured. Moreover, heat resistance between the heat sink and ambient air can decrease, thereby increasing the heat dissipating capacity of the heat sink.

Although the present invention has been described with reference to a preferred embodiment thereof, it will be apparent to one of ordinary skill in the art that modifications of the described embodiment may be made without departing from the spirit and scope of the invention.

What is claimed is:

1. An apparatus for cooling a semiconductor package comprising:
 a heat sink mounted to the semiconductor package and including:
  a base plate;
  a support bar installed over the base plate;
  a plurality of parallel fins extending from the base plate;
  plates which guide air flow in the heat sink to the central part thereof; and
 a fan mounted to the support bar of the heat sink, wherein the air guide plates are inclined along the fins, with decreasing height of the fins from the peripheral part towards the central part of the heat sink.

2. The apparatus of claim 1, wherein the plates are parallel and face each other whereby air flows in a horizontal direction.

3. The apparatus of claim 1, wherein the air guide plates are adjacent to each other crossing in a vertical direction and a horizontal direction so that air flows in a diagonal direction.

4. The apparatus of claim 1, wherein the central part of the heat sink comprises fins of the same length.

5. The apparatus of claim 4, wherein the fins at the central part of the heat sink are shorter than those at the peripheral part thereof.

6. The apparatus of claim 4, wherein at least one fin at the central part of the heat sink is higher than those at the peripheral part thereof.

7. The apparatus of claim 1, wherein the fins are rectangular in shape and arranged in a checkerboard pattern.

8. The apparatus of claim 1, wherein the fan includes a motor at a central part thereof and a plurality of blades at the peripheral part thereof, tie peripheral part of the fan serving as a passage for the inflow and outflow of air, and wherein the fan is removably attached to the heat sink.

* * * * *